(12) United States Patent
Spindler et al.

(10) Patent No.: US 8,877,356 B2
(45) Date of Patent: Nov. 4, 2014

(54) OLED DEVICE WITH STABILIZED YELLOW LIGHT-EMITTING LAYER

(75) Inventors: Jeffrey P. Spindler, Rochester, NY (US); Tukaram K. Hatwar, Penfield, NY (US)

(73) Assignee: Global OLED Technology LLC, Herndon, VA (US)

( * ) Notice: Subject to any disclaimer, the term of this patent is extended or adjusted under 35 U.S.C. 154(b) by 506 days.

(21) Appl. No.: 12/507,371

(22) Filed: Jul. 22, 2009

(65) Prior Publication Data
US 2011/0018429 A1    Jan. 27, 2011

(51) Int. Cl.
| H01L 51/50 | (2006.01) |
| H05B 33/14 | (2006.01) |
| C09K 11/06 | (2006.01) |
| H01L 51/00 | (2006.01) |

(52) U.S. Cl.
CPC ......... *H01L 51/0054* (2013.01); *H01L 51/0058* (2013.01); *H05B 33/14* (2013.01); *C09K 2211/1011* (2013.01); *C09K 11/06* (2013.01); *C09K 2211/1037* (2013.01); *H01L 51/006* (2013.01); *H01L 51/0072* (2013.01); *H01L 51/5012* (2013.01); *Y10S 428/917* (2013.01)
USPC .......... 428/698; 428/917; 313/504; 313/505; 313/506; 257/40; 257/E51.05; 257/E51.026; 257/E51.032; 564/26; 564/426; 564/434; 548/340.1; 548/418

(58) Field of Classification Search
USPC .................. 428/690, 917; 313/504, 505, 506; 564/26, 426, 434; 257/40, E51.05, 257/E51.026, E51.032; 548/304.1, 418, 548/440
See application file for complete search history.

(56) References Cited

U.S. PATENT DOCUMENTS

| 5,061,569 | A | 10/1991 | VanSlyke et al. |
| 5,294,870 | A | 3/1994 | Tang et al. |
| 5,409,783 | A | 4/1995 | Tang et al. |
| 5,552,678 | A | 9/1996 | Tang et al. |
| 5,554,450 | A | 9/1996 | Shi et al. |
| 5,593,788 | A | 1/1997 | Shi |
| 5,683,823 | A | 11/1997 | Shi |
| 5,688,551 | A | 11/1997 | Littman et al. |
| 5,703,436 | A | 12/1997 | Forrest et al. |
| 5,851,709 | A | 12/1998 | Grande et al. |
| 5,908,581 | A | 6/1999 | Chen et al. |
| 5,928,802 | A | 7/1999 | Shi |
| 6,020,078 | A | 2/2000 | Chen et al. |
| 6,066,357 | A | 5/2000 | Tang et al. |
| 6,208,077 | B1 | 3/2001 | Hung |
| 6,337,492 | B1 | 1/2002 | Jones et al. |
| 6,387,547 | B1 | 5/2002 | Fujita et al. |
| 6,613,454 | B2 | 9/2003 | Ara et al. |
| 6,951,693 | B2 | 10/2005 | Hosokawa et al. |
| 7,052,785 | B2 | 5/2006 | Begley et al. |
| 7,622,619 | B2 | 11/2009 | Coggan |
| 7,948,165 | B2 | 5/2011 | Spindler |
| 8,153,275 | B2 | 4/2012 | Hamada |
| 2004/0029118 | A1 | 2/2004 | Kunsch et al. |
| 2005/0079281 | A1* | 4/2005 | Pethe et al. ................ 427/109 |
| 2005/0079381 | A1 | 4/2005 | Hamada et al. |
| 2005/0153163 | A1 | 7/2005 | Klubek et al. |
| 2005/0211958 | A1 | 9/2005 | Conley et al. |
| 2005/0260422 | A1 | 11/2005 | Hart et al. |
| 2005/0260442 | A1* | 11/2005 | Yu et al. ..................... 428/690 |
| 2006/0127698 | A1 | 6/2006 | Tokailin et al. |
| 2006/0159952 | A1 | 7/2006 | Ricks et al. |
| 2006/0238119 | A1* | 10/2006 | Spindler .................... 313/506 |
| 2007/0059556 | A1 | 3/2007 | Kim et al. |
| 2007/0092756 | A1* | 4/2007 | Begley et al. ............. 428/690 |
| 2007/0134512 | A1 | 6/2007 | Klubek et al. |
| 2007/0141393 | A1 | 6/2007 | Klubek et al. |
| 2007/0278941 | A1 | 12/2007 | Zheng et al. |
| 2008/0182129 | A1 | 7/2008 | Klubek et al. |
| 2008/0286445 | A1 | 11/2008 | Suzuki et al. |
| 2009/0001874 | A1 | 1/2009 | Yen |
| 2009/0053557 | A1 | 2/2009 | Spindler |
| 2009/0146552 | A1 | 6/2009 | Spindler et al. |

FOREIGN PATENT DOCUMENTS

| CN | 1583691 | 2/2005 |
| EP | 1182183 | 2/2002 |
| JP | 10-289786 | 10/1998 |
| JP | 2003-146951 | 5/2003 |
| KR | 2009-0046371 | 5/2009 |
| WO | 2005/029607 | 3/2005 |
| WO | 2007/021117 | 2/2007 |
| WO | 2007-058503 | 5/2007 |
| WO | 2007-081179 | 7/2007 |
| WO | 2008-013399 | 1/2008 |
| WO | 2009-061145 | 5/2009 |
| WO | 2009-061156 | 5/2009 |

OTHER PUBLICATIONS

Chen et al., "Recent Developments in Molecular Organic Electroluminescent Materials", Macromol. Symp. 125, pp. 1-48, 1997.
Hung et al., "Recent progress of molecular organic electroluminescent materials and devices", Materials Science and Engineering R39, pp. 143-222, 2002.

* cited by examiner

*Primary Examiner* — Gregory Clark
(74) *Attorney, Agent, or Firm* — Global OLED Technology LLC

(57) ABSTRACT

The invention provides an OLED device including an anode, a cathode and a yellow light-emitting layer located therebetween, the light-emitting layer comprising a 9,10-diarylanthracene host; a yellow light-emitting 5,6,11,12-tetraphenyltetracene derivative where as least 1 of the phenyl groups is further substituted and a non-light-emitting diarylamine substituted 9,10-diarylsubstituted anthracene stabilizer. Devices of the invention provide improvement in features such as stability and efficiency while maintaining excellent color.

8 Claims, 2 Drawing Sheets

OLED DEVICE WITH STABILIZED YELLOW LIGHT-EMITTING LAYER

CROSS-REFERENCE TO RELATED APPLICATIONS

Reference is made to commonly assigned U.S. patent application Ser. No. 11/668,515 (U.S. Patent Application Publication No. 2008/0182129), filed Jan. 30, 2007, entitled "OLEDS Having High Efficiency and Excellent Lifetime" by Kevin P. Klubek et al and U.S. patent application Ser. No. 12/394,935 filed Feb. 27, 2009, entitled "OLED Device With Stabilized Green Light-Emitting Layer" by Marina E. Kondakov et al, the disclosures of which are incorporated herein.

FIELD OF THE INVENTION

This invention relates to an electroluminescent (EL) device, more specifically, an organic light-emitting diode (OLED) device having a yellow light-emitting layer containing a 9,10-diarylanthracene host, a substituted rubrene as a light-emitting dopant and a diarylamino substituted 9,10-diarylsubstituted anthracene stabilizer.

BACKGROUND OF THE INVENTION

While organic electroluminescent (EL) devices have been known for over two decades, their performance limitations have represented a barrier to many desirable applications. In their simplest forms, organic light-emitting devices (OLEDs), also referred to as organic electroluminescent devices or as organic internal junction light-emitting devices, contain spaced electrodes separated by an organic light-emitting structure (also referred to as an organic EL medium) which emits light in response to the application of an electrical potential difference across the electrodes. At least one of the electrodes is light-transmissive, and the organic light-emitting structure can have multiple layers of organic thin films which provide for hole injection and transport from an anode, and for electron injection and transport from a cathode, respectively, with light emission resulting from electron-hole recombination at an internal junction formed at an interface between the hole-transporting and the electron-transporting thin films.

EL devices in recent years have expanded to include not only single color emitting devices, such as red, green and blue, but also white-devices, devices that emit white light. Efficient white light producing OLED devices are highly desirable in the industry and are considered as a low cost alternative for several applications such as paper-thin light sources, backlights in LCD displays, automotive dome lights, and office lighting. White light producing OLED devices should be bright, efficient, and generally have Commission International d'Eclairage (CIE) 1931 chromaticity coordinates of about (0.33, 0.33). In any event, in accordance with this disclosure, white light is that light which is perceived by a user as having a white color. Typical color combinations that produce white light are red, green and blue; blue-green and orange; blue and yellow but others are known.

Since the early inventions, further improvements in device materials have resulted in improved performance in attributes such as color, stability, luminance efficiency and manufacturability, e.g., as disclosed in U.S. Pat. Nos. 5,061,569; 5,409,783; 5,554,450; 5,593,788; 5,683,823; 5,908,581; 5,928,802; 6,020,078, and 6,208,077, amongst others.

Notwithstanding all of these developments, there are continuing needs for organic EL device components, such as yellow light-emitting layers, which will provide even lower device drive voltages and hence lower power consumption, while maintaining high luminance efficiencies and long lifetimes combined with high color purity. Such yellow light-emitting layers are useful for white light-producing OLEDs.

Commonly assigned U.S. Patent Application Publication No. 2008/0182129 discloses OLED devices with light-emitting layers containing an anthracene host, amino substituted anthracene dopants and can include additional dopants, including tetracenes.

U.S. Patent Application Publication Nos. 2009/0001874; 2008/0286445, and EP1182183 and WO2005029607 all disclose OLEDs where the light-emitting layers can contain anthracenes, amino substituted anthracenes and tetracenes among other materials.

U.S. Patent Application Publication Nos. 2005/0079381 discloses OLEDs with a light-emitting layer that contains a host, a light-emitting dopant and a first light-emission assisting dopant which is a tetracene. There may be a second light-emission assisting dopant which is an amine.

Diarylamino substituted 9,10-diarylanthracenes in OLED devices have described in U.S. Pat. No. 6,951,693, U.S. Patent Application Publication Nos. 2005/0153163; 2007/0134512; 2005/0260422; 2006/0127698; 2004/0209118; 2007/059556; and JP2003146951, KR2009046731, WO2007021117, WO2009061156, WO2009061145, WO2008013399, WO2007081179, and WO2007058503.

5,6,11,12-Tetraphenyltetracene (rubrene) derivatives where the phenyl groups are substituted are known as yellow emitters; see U.S. Pat. Nos. 6,387,547; 7,052,785; 6,613,454; U.S. Patent Application Publication No. 2005/0079381, and JP10289786.

However, these devices do not necessarily have all desired EL characteristics in terms of high luminance, low drive voltages, and sufficient operational stability. Notwithstanding all these developments, there remains a need to improve efficiency and reduce drive voltage of OLED devices, as well as to provide embodiments with other improved features.

SUMMARY OF THE INVENTION

The invention provides an OLED device comprising an anode, a cathode and a yellow light-emitting layer located therebetween, the light-emitting layer comprising:

(a) a 9,10-diarylanthracene host;

(b) a yellow light-emitting tetracene according to Formula (2):

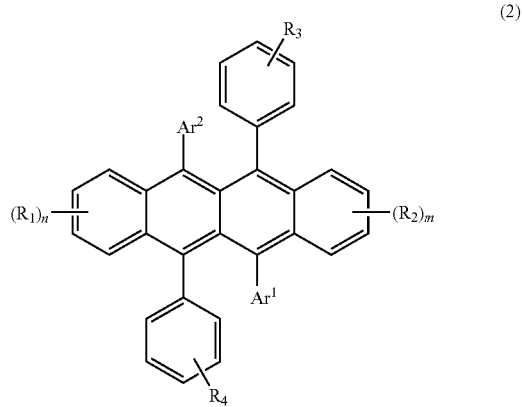

wherein:

Ar¹ and Ar² are independently selected phenyl groups;

R₁ and R₂ are independently selected from alkyl or aryl groups with n and m being independently selected from 0, 1 and 2; and R₃ and R₄ are independently selected from hydrogen, alkyl, aryl or heteroaromatic groups; and (c) a non-light-emitting diarylamine substituted 9,10-diarylsubstituted anthracene according to Formula (3):

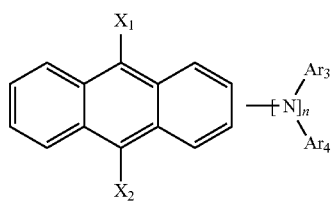

(3)

wherein:

X₁ and X₂ are independently selected aryl groups of 6 to 30 nucleus carbon atoms;

Ar₃ and Ar₄ each independently represents a substituted or unsubstituted aryl group of 6 to 30 nucleus carbon atoms where Ar₃ and Ar₄ can optionally be joined together; and n is 1 or 2.

Devices of the invention provide improvement in features such as increased stability, increased efficiency or lower drive voltage or combinations thereof.

DETAILED DESCRIPTION OF THE INVENTION

Figure 1:
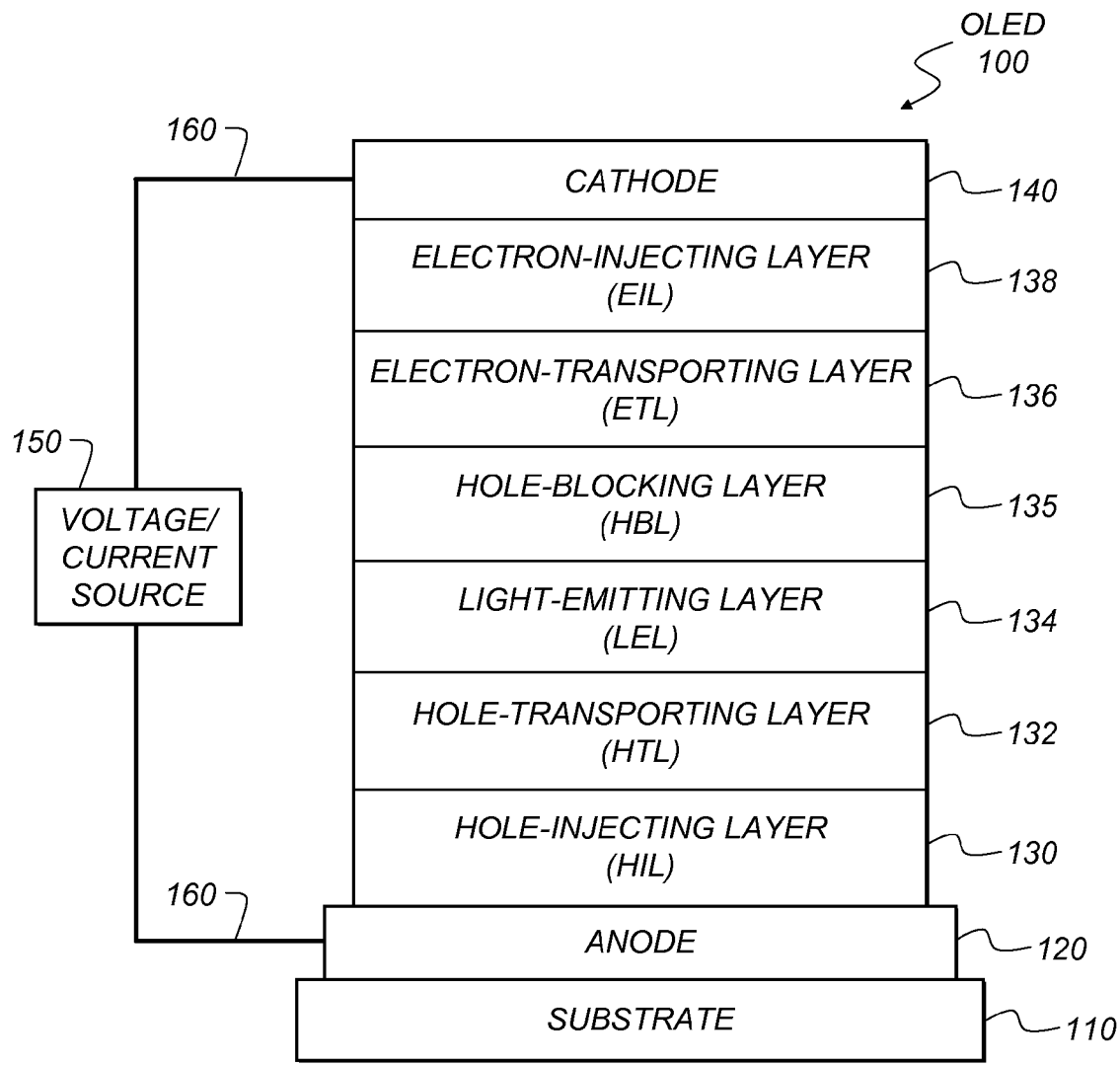
FIG. 1 shows a schematic cross-sectional view of one embodiment of an inventive OLED device. It will be understood that FIG. 1 is not to scale since the individual layers are too thin and the thickness differences of various layers are too great to permit depiction to scale.

The invention is generally as described above. An OLED device of the invention is a multilayer electroluminescent device including a cathode, an anode, light-emitting layer(s) (LEL), electron-transporting layer(s) (ETL) and electron-injecting layer(s) (EIL) and optionally additional layers such as hole-injecting layer(s), hole-transporting layer(s), exciton-blocking layer(s), spacer layer(s), connecting layer(s) and hole-blocking layer(s).

The light-emitting layer of the invention emits yellow light. Yellow light is generally considered to be light with a wavelength of about 570-580 nm, although a suitable mixture of somewhat longer and shorter wavelengths will also appear yellow. In terms of CIE chromaticity coordinates, yellow light is generally in the range of about (0.5, 0.5) where $CIE_x$ ranges from 0.48-0.52 and $CIE_y$ ranges from (0.47-0.52).

The host of the light-emitting layer of the invention is a 9,10-diarylanthracene. A host material is commonly understood to be non-emitting; that is, produces no significant (less than 10% of the total) amount of light produced by that layer. 9,10-Diarylanthracenes, particularly when they have no amine substituents, generally emit blue light. In a yellow layer, the amount of emitted light from the anthracene, if any, can be easily determined by examination of the spectrum of the emitted light.

The anthracene host of the invention is according to Formula (1).

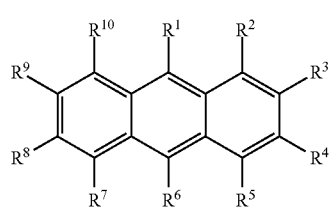

(1)

In Formula (1), $R^1$ and $R^6$ each independently represents an aryl group having 6-24 carbon atoms such as a phenyl group or a naphthyl group. $R^2$—$R^5$ and $R^7$-$R^{10}$ are each independently chosen from hydrogen, alkyl groups from 1-24 carbon atoms or aromatic groups (including heterocyclic aromatic groups) from 5-24 carbon atoms. In useful hosts, the anthracene nucleus should not be directly substituted with a heteroatom.

In one suitable embodiment $R^1$ and $R^6$ each represent an independently selected phenyl group, biphenyl group, or naphthyl group. $R^3$ represents hydrogen or an aromatic group from 6-24 carbon atoms. $R^2$, $R^4$, $R^5$, $R^7$-$R^{10}$ represent hydrogen.

Illustrative examples of useful anthracene hosts are listed below.

AH-1

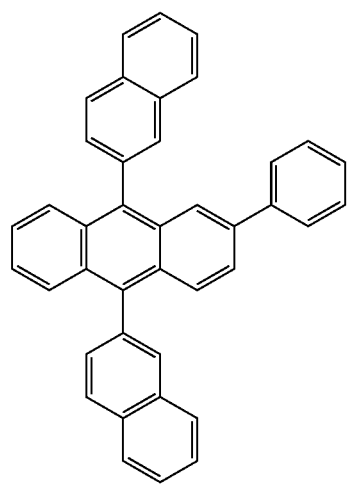

AH-2

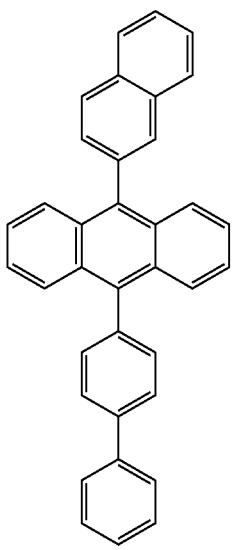

AH-5

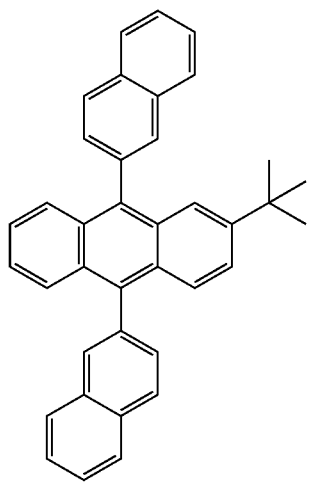

AH-3

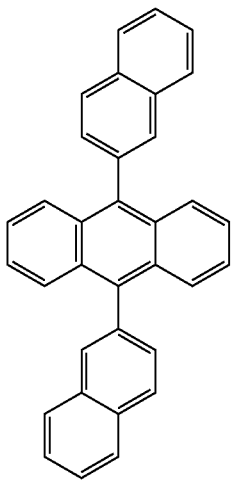

AH-6

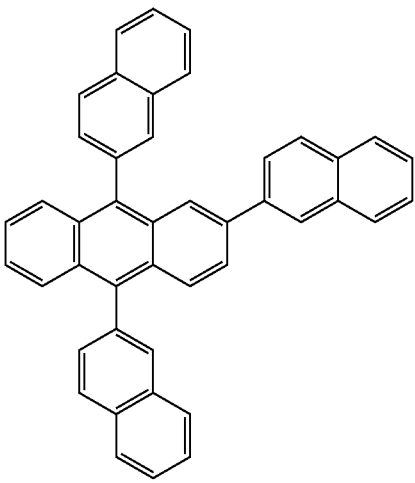

AH-4

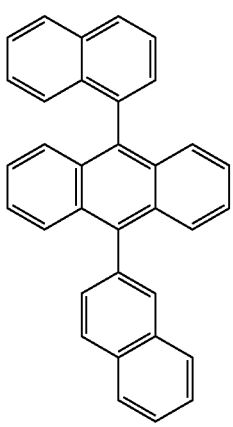

The light-emitting layer of the invention contains a yellow light-emitting tetracene. A tetracene (also called a naphthacene) includes a core of 4 phenyl fused together in a linear fashion and does not contain any additionally fused aromatic rings to the core. A specific tetracene derivative is rubrene, which is 5,6,11,12-tetraphenyltetracene. Rubrene is not a tetracene of the invention. Inventive tetracenes are rubrene derivatives that have at least one substituent on at least one, but preferably two, of the 5,6,11,12 phenyl groups. The tetracene should provide more than 90% of the total light output of the inventive layer, which desirably has no detectable output from the anthracene host and less than about 10% from the stabilizer, and the spectral output should not be significantly perturbed by the presence of the anthracene host and stabilizer. Significant change in spectral data can be defined using shift of the emission maximum ($\lambda_{max}$). Shifts of about 10 nm $\lambda_{max}$ can be considered as negligible spectral change.

The yellow light-emitting tetracene is according to Formula (2):

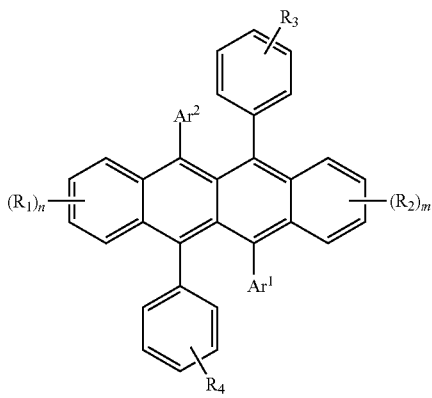

(2)

wherein $Ar^1$ and $Ar^2$ are independently selected phenyl groups, $R_1$ and $R_2$ are independently selected from alkyl or aryl groups with n and m being independently selected from is 0, 1 and 2 and $R_3$ and $R_4$ are independently selected from hydrogen, alkyl, aryl or heteroaromatic groups.

In formula (2), $Ar^1$ and $Ar^2$ represent substituted or unsubstituted phenyl rings. Suitable non-hydrogen substituents for these phenyl rings are alkyl, preferably tertiary alkyl groups such as t-butyl; aryl, preferably phenyl; alkenyl such as styryl ($-CH=CH-C_6H_5$); alkynyl such as $-C\equiv C-C_6H_5$; fluoro; amino such as diphenylamino; or alkyloxy such as methoxy.

$R_1$ and $R_2$ are independently selected from alkyl, preferably tertiary alkyl groups such as t-butyl, or aryl groups, preferably phenyl or naphthyl groups. These groups can be substituted or unsubstituted. It is preferred that n and m be either both 0 or both 1. If n or m is 2 so that there are two adjacent substituents, $R_1$ and $R_2$ can be optionally fused together to form a non-aromatic ring such as cyclohexyl. However, adjacent substituents on the tetracene core should not form additional fused aromatic rings.

$R_3$ and $R_4$ are each a single substituent located on the 5, 11-(alternatively 6,12-) phenyl groups, preferably para to the tetracene core. The alkyl or aryl substituents are the same as described for $R_1$ and $R_2$. The heteroaromatic group contains at least one heteroatom as part of an aromatic ring. The heteroaromatic group should not be attached to the tetracene core via the heteroatom. Examples of suitable heteroaromatic groups are benzothiazole, benzimidiazole, benzoxadiazoleole, pyrrole, purine, phenanthroline, pyridine, thiophene, quinoline and isoquinoline. These can be further substituted. Preferred are benzothiazole groups, particularly 6-methylbenzothiazole-2-yl.

There are two preferred types of useful tetracene derivatives. The first is where the tetracene is according to Formula (2a):

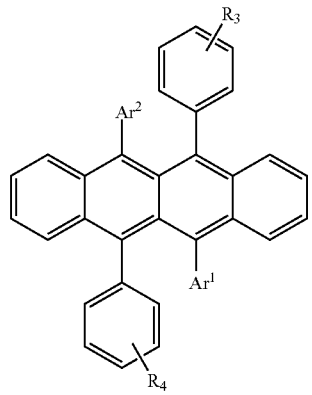

(2a)

wherein $Ar^1$, $Ar^2$, $R_3$ and $R_4$ and are the same as described for formula (2). It is preferred that $R_3$ and $R_4$ are the same and located para to the teracene core. Most preferred substituents for $Ar^1$ and $Ar^2$ are unsubstituted phenyl. Most preferred substituents for $R_3$ and $R_4$ are heteroaromatic, especially benzothiazole.

The second preferred type of tetracene is according to Formula (2b):

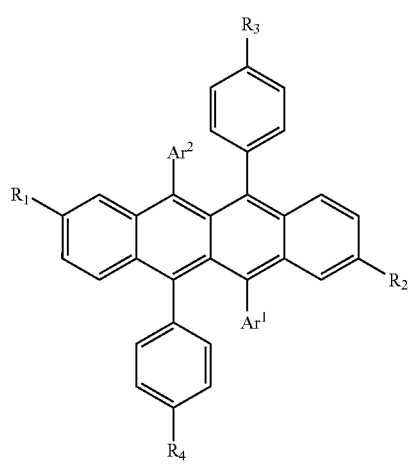

(2b)

wherein $Ar^1$ and $Ar^2$ are the same as described in formula (2) and $R_1$, $R_2$, $R_3$ and $R_4$ are all the same alkyl or aryl group. Most preferred are where $R_1$, $R_2$, $R_3$ and $R_4$ are all tertiary alkyl groups. Most preferred $Ar^1$ and $Ar^2$ groups are biphenyl.

Some illustrative examples of compounds according to Formula (2) are:
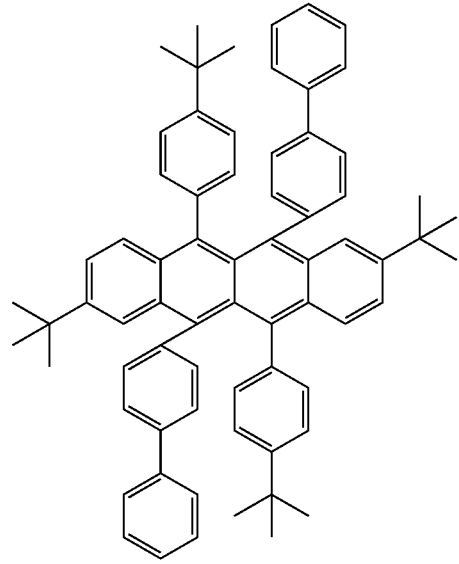
TD-1
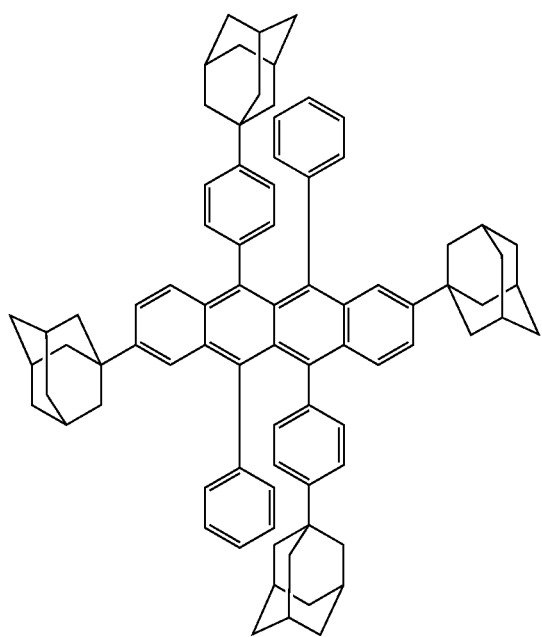
TD-2
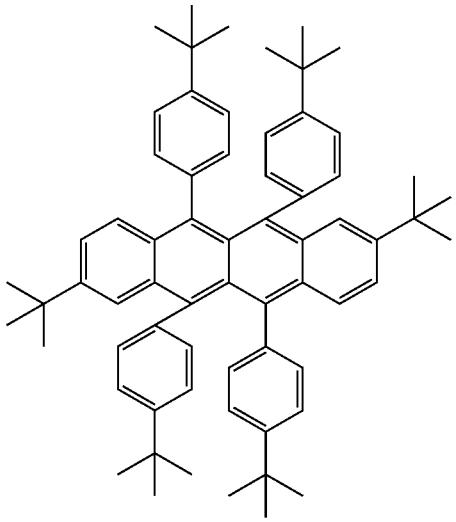
TD-3
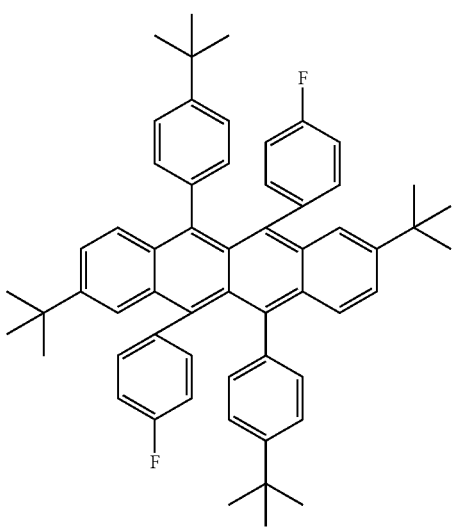
TD-4
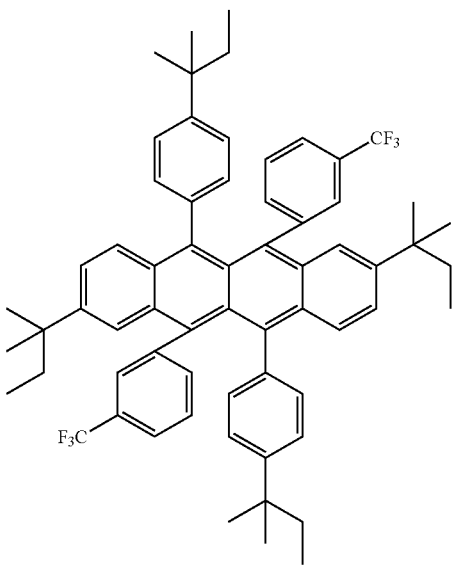
TD-5

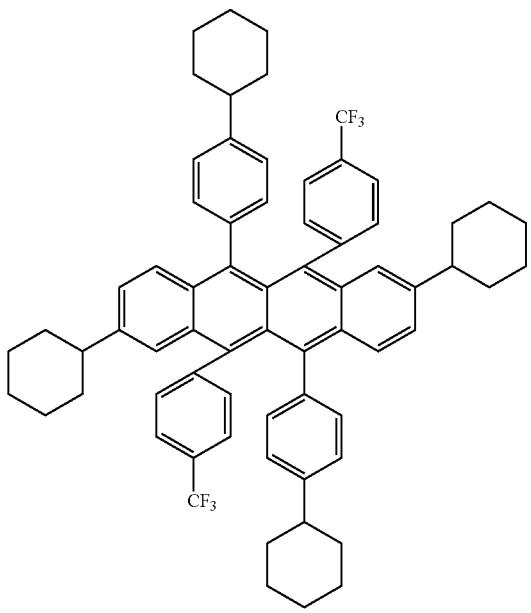

TD-6

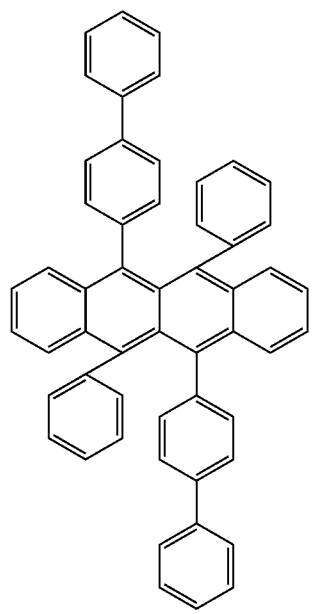

TD-7

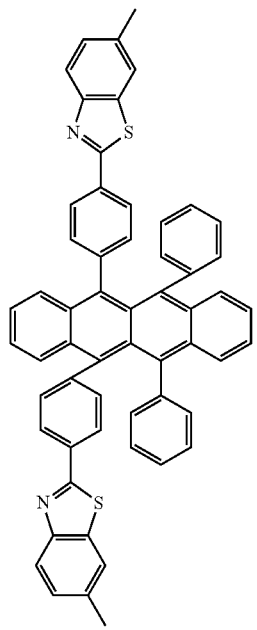

TD-8

The light-emitting layer of the invention also contains a diarylamine substituted 9,10-diarylanthracene as a non-light-emitting stabilizer. Diarylamine substituted 9,10-diarylanthracenes generally emit green light. To reduce or avoid light emission from the diarylamine substituted 9,10-diarylanthracene, the stabilizer should be chosen such that its energy of excited state is higher than that of the yellow light-emitting tetracene. The amount of green light emitted from the stabilizer should not be significant; in other words, no more than 10% of the total amount of light submitted from that layer and preferably no more than about 5% of the total amount of light. In a yellow layer, the amount of emitted light from the amino substituted anthracene can be easily determined by examination of the spectrum of the emitted light.

The diarylamine substituted 9,10-diarylsubstituted anthracene is according to Formula (3):

$$\text{(3)}$$

wherein $X_1$ and $X_2$ are independently selected aryl groups of 6 to 30 nucleus carbon atoms; $Ar_1$, $Ar_2$, $Ar_3$ and $Ar_4$ each independently represents a substituted or unsubstituted aryl group of 6 to 30 nucleus carbon atoms where $Ar_1$ and $Ar_2$ or $Ar_3$ and $Ar_4$ can optionally be joined together; and n is 1 or 2. The diarylamine substituent is attached directly to the anthracene core via the nitrogen.

Preferred diarylamine substituted 9,10-diarylsubstituted anthracenes are those where $X_1$ and $X_2$ are phenyl or naphthyl groups with phenyl being most preferred. Preferably, n is 2 and the diarylamino groups are located in the 2,6 positions of the anthracene. $Ar_1$, $Ar_2$, $Ar_3$ and $Ar_4$ are preferably phenyl groups, naphthyl groups or where $Ar_1$ and $Ar_2$ or $Ar_3$ and $Ar_4$ are joined together to form a carbAH-6ole ring. Any of these groups can be further substituted.

Some illustrative examples of compounds according to Formula (3) are:
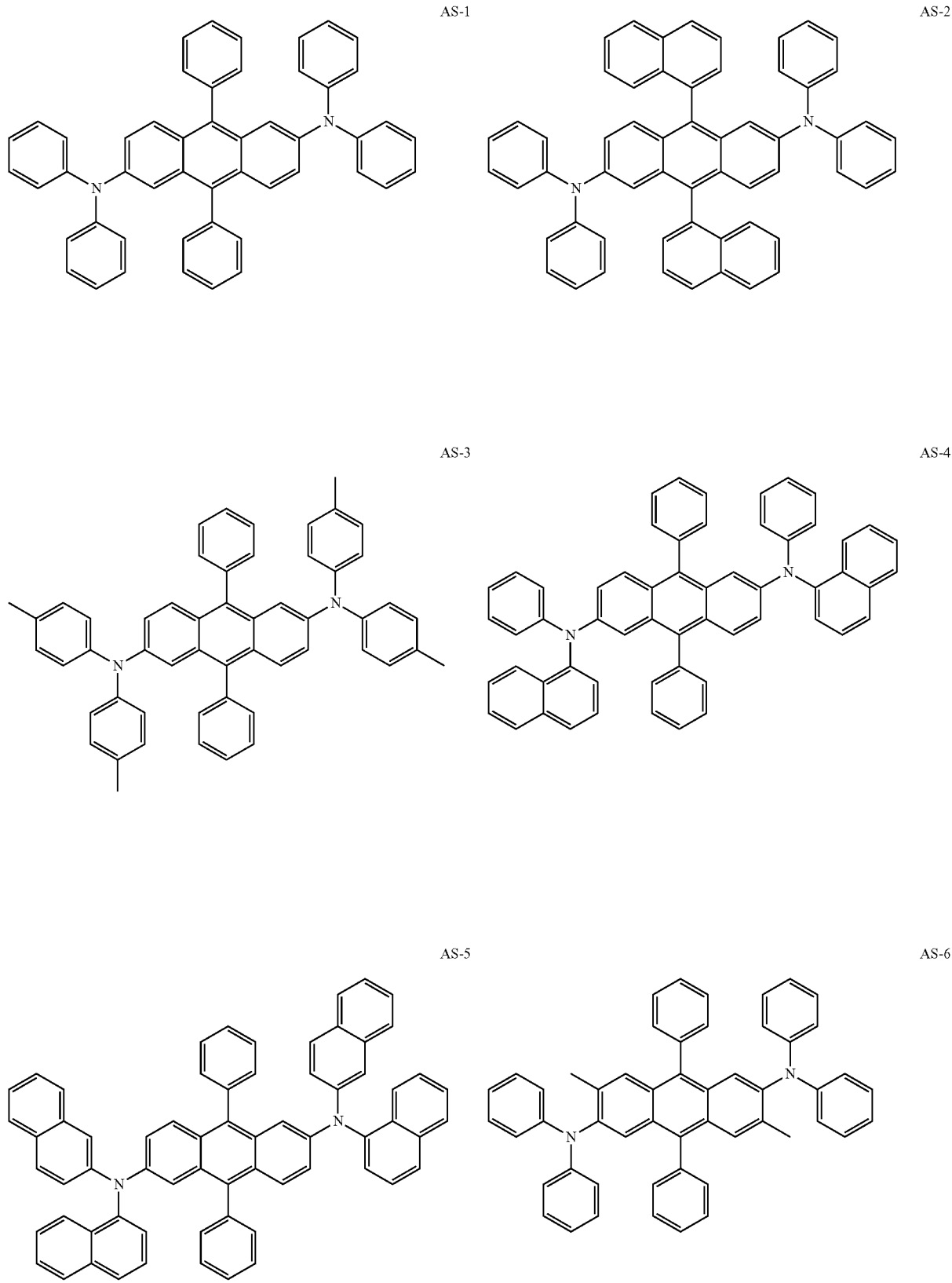

-continued
AS-7
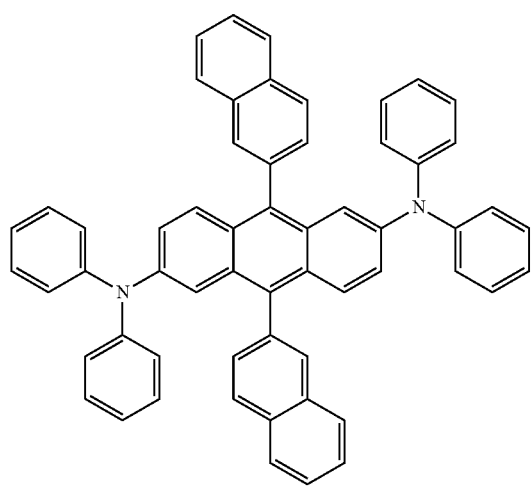
AS-8
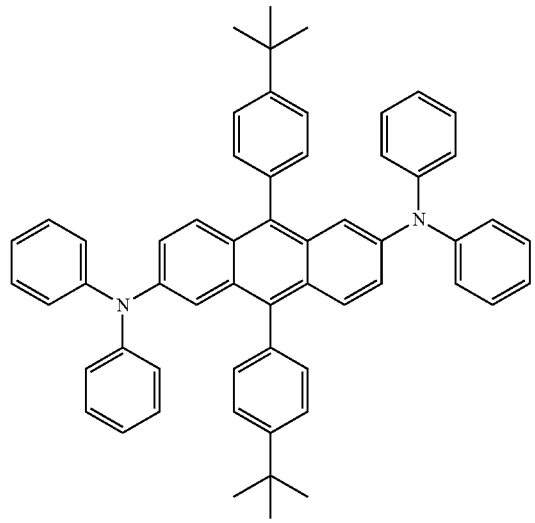
AS-9
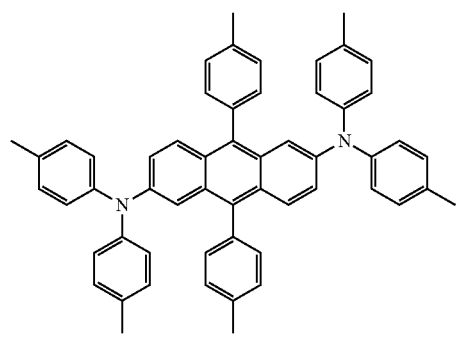
AS-10
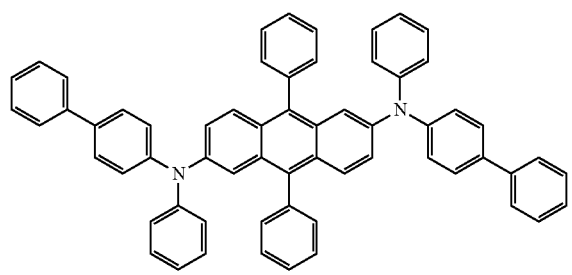
AS-11
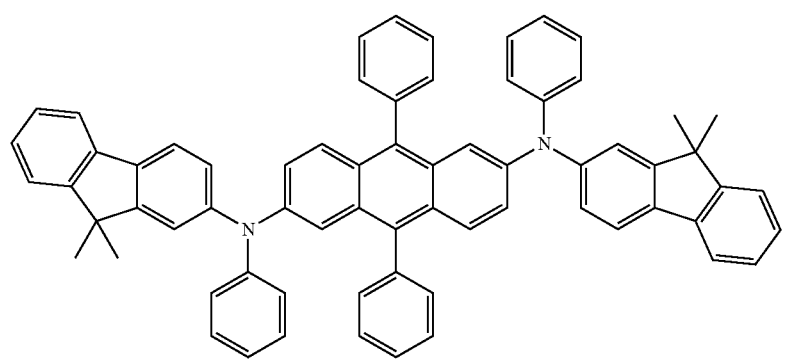

-continued
AS-12
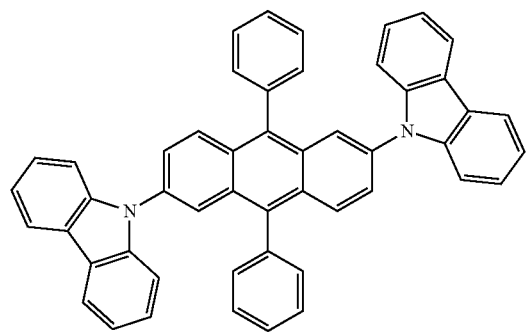
AS-13
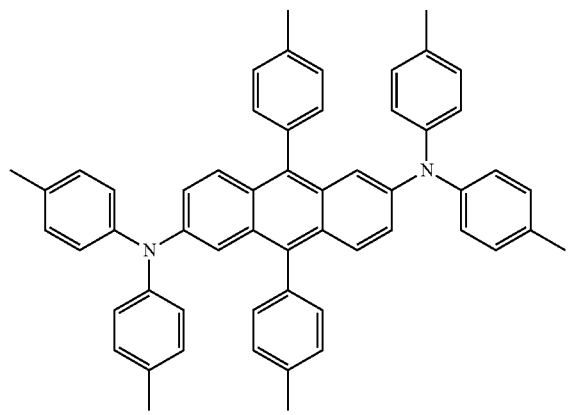
AS-14
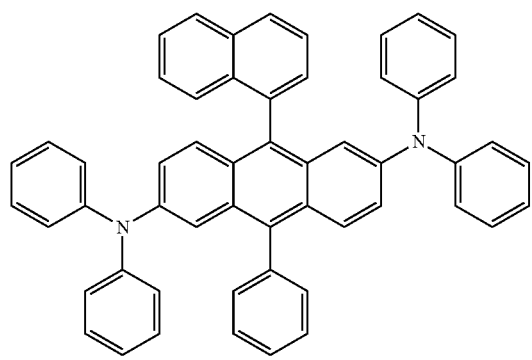
AS-15
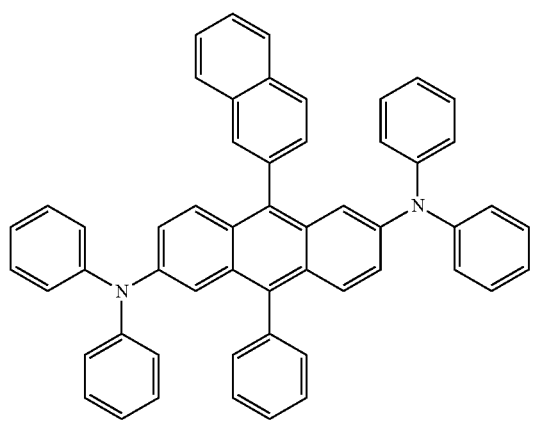
AS-16
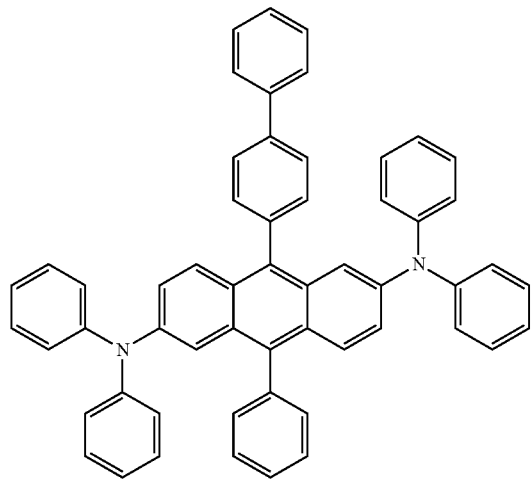
AS-17
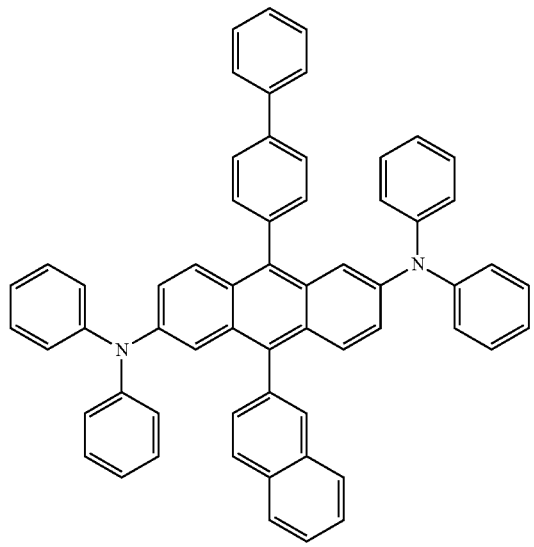

-continued
AS-18
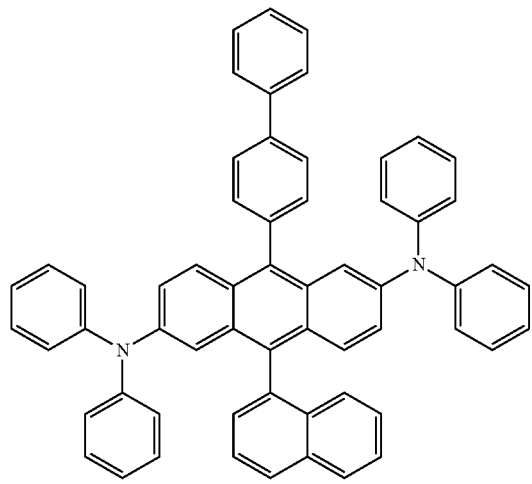
AS-19
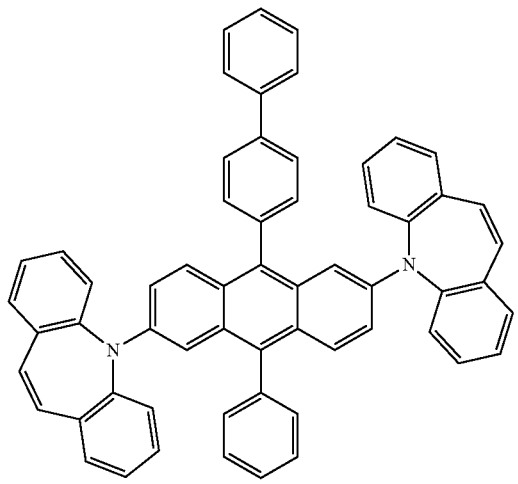
AS-20
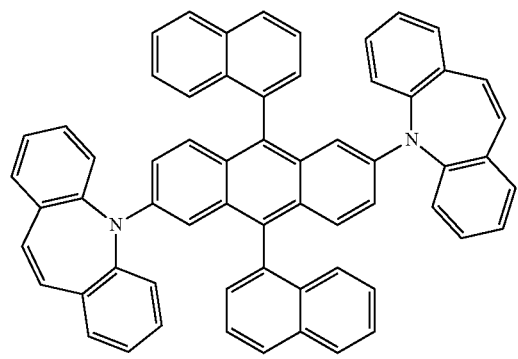
AS-21
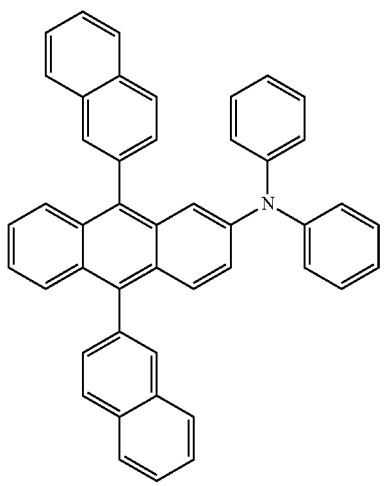
AS-22
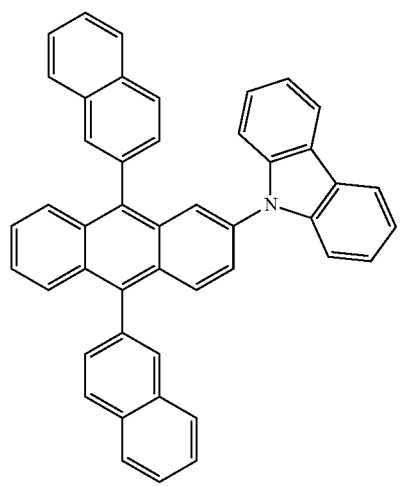
AS-23
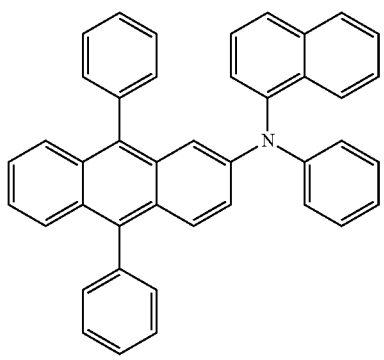

AS-24

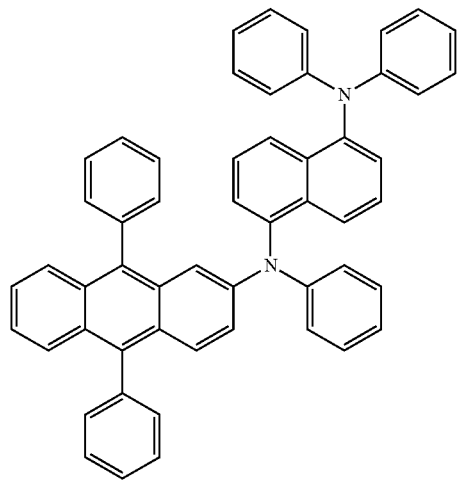

The yellow LEL of the invention can contain additional co-hosts besides the anthracene. The additional co-host should not significantly emit light and can be, for example, another anthracene, or a tertiary amine compound such those known to be useful in hole-transporting layers. If present as a single host, the amount of the anthracene host can range from 35% to 99% by volume, desirably in the range of 45 to 98% by volume. If the anthracene is present as a mixture of hosts, the total amount of all hosts should also be 45% to 99% by volume, desirably in the range of 45 to 98% volume. The amount of anthracene in the mixture of hosts is not limited but suitably is 50% or greater by volume of the total amount of host. The yellow LEL of the invention contains a substituted tetracene as a yellow light-emitting compound. Appropriate ranges of the tetracene are 0.5%-20% by volume, with a preferred range of 1-15% by volume and a most desirable range of 3% to 10% by volume. The yellow LEL of the inventions contains a stabilizer compound which is diarylamino substituted 9,10-diarylanthracene. A suitable range for the stabilizer is from 0.5%-45% by volume, with a preferred range of 1-40% by volume with a most preferred range of 5-30% by volume. Based on these ranges, preferred concentration (by volume) for all components in an inventive yellow LEL would be the diarylamino substituted 9,10-diarylanthracene stabilizer in the range of 1-40% by volume and the emitting tetracene in the range of 1%-15% by volume with the remainder being host(s). Even more preferred would be where the diarylamino substituted 9,10-diarylanthracene stabilizer is in the range of 5-30% by volume and the tetracene in the range of 3%-10% by volume with the remainder being host(s).

Examples of preferred combinations of the invention are those wherein the anthracene host compound is selected from AH-1, AH-4 and AH-6, the tetracene light-emitting compound is selected from TD-1 and TD-8, and the bis-diarylamine 9,10-substituted anthracene stabilizer is selected from AS-1, AS-2, AS-12 and AS-21. Any of these possible combinations are desirable. The most desirable combinations are where the anthracene host compound is AH-1, the tetracene light-emitting compound is selected from TD-1 and TD-8 and the bis-diarylamine 9,10-substituted anthracene dopant is AS-1.

In one suitable embodiment the EL device emits white light, which can include complimentary emitters, a white emitter, or using filters. To produce a white emitting device, ideally the device would include a layer with a blue fluorescent emitter together with proper proportions of the inventive yellow emitting layer suitable to make white emission. This invention can be used in so-called stacked device architecture, for example, as taught in U.S. Pat. Nos. 5,703,436 and 6,337,492. Embodiments of the current invention can be used in stacked devices that comprise solely fluorescent elements to produce white light. The yellow LEL of the invention is a fluorescent layer. The white device can also include combinations of fluorescent emitting materials and phosphorescent emitting materials (sometimes referred to as hybrid OLED devices).

In one desirable embodiment the EL device is part of a display device. In another suitable embodiment the EL device is part of an area lighting device. The EL device of the invention is useful in any device where stable light emission is desired such as a lamp or a component in a static or motion imaging device, such as a television, cell phone, DVD player, or computer monitor.

As used herein and throughout this application, chemical terms are generally as defined by the *Grant & Hackh's Chemical Dictionary*, Fifth Edition, McGraw-Hill Book Company. For the purpose of this invention, also included in the definition of a heterocyclic ring are those rings that include coordinate bonds. The definition of a coordinate or dative bond can be found in *Grant & Hackh's Chemical Dictionary*, pages 91 and 153. The definition of a ligand, including a multidentate ligand, can be found in *Grant & Hackh's Chemical Dictionary*, pages 337 and 176, respectively. Unless otherwise specifically stated, use of the term "substituted" or "substituent" means any group or atom other than hydrogen. Additionally, when the term "group" is used, it means that when a substituent group contains substitutable hydrogen, it is also intended to encompass not only the substituent's unsubstituted form, but also its form further substituted with any substituent group or groups as herein mentioned, so long as the substituent does not destroy properties necessary for device utility. If desired, the substituents can themselves be further substituted one or more times with the described substituent groups. The particular substituents used can be selected by those skilled in the art to attain desirable properties for a specific application and can include, for example, electron-withdrawing groups, electron-donating groups, and groups providing steric bulk. When a molecule can have two or more substituents, the substituents can be joined together to form a ring such as a fused ring unless otherwise provided.

Basic OLED information and description of the layer structure, material selection, and fabrication process for OLED devices can be found in the following along with the references cited therein: Chen, Shi, and Tang, "Recent Developments in Molecular Organic Electroluminescent Materials," *Macromol. Symp.* 125, 1 (1997); Hung and Chen, "Recent Progress of Molecular Organic Electroluminescent Materials and Devices," *Mat. Sci. and Eng.* R39, 143 (2002); H. Yersin, "Highly Efficient OLEDS with Phosphorescent Materials" (Wiley-VCH (Weinheim), 2007); K. Mullen and U. Scherf, "Organic Light Emitting Devices; Synthesis, Properties and Applications" (Wiley-VCH (Weinheim), 2006); J. Kalinowski, "Organic Light-Emitting Diodes; Principles, Characteristics and Processes (Optical Engineering)" (Dekker (NY), 2004); Z. Li and H. Meng, "Organic Light-Emitting Materials and Devices (Optical Science and Engineering)" (CRC/Tayler&Francis (Boca Raton), 2007) and J. Shinar, "Organic Light-Emitting Devices" (Springer (NY), 2002).

The present invention can be employed in many OLED configurations using small molecule materials, oligomeric materials, polymeric materials, or combinations thereof. These include from very simple structures having a single anode and cathode to more complex devices, such as passive matrix displays having orthogonal arrays of anodes and cathodes to form pixels, and active-matrix displays where each pixel is controlled independently, for example, with thin film transistors (TFTs). There are numerous configurations of the organic layers wherein the present invention is successfully practiced. For this invention, essential requirements are a cathode, an anode and a LEL.

One embodiment according to the present invention and especially useful for a small molecule device is shown in FIG. 1. OLED 100 contains a substrate 110, an anode 120, a hole-injecting layer 130, a hole-transporting layer (HTL) 132, a light-emitting layer (LEL) 134, a hole-blocking layer (HBL) 135, an electron-transporting layer (ETL) 136, an electron-injecting layer (EIL) 138 and a cathode 140. The LEL 134 contains the inventive combination of anthracene host, tetracene dopant and stabilizer compound. In some other embodiments, there are optional spacer layers on either side of the LEL 134. These spacer layers do not typically contain light emissive materials. All of these layer types will be described in detail below. Note that the substrate 110 can alternatively be located adjacent to the cathode 140, or the substrate 110 can actually constitute the anode 120 or cathode 140. Also, the total combined thickness of the organic layers is preferably less than 500 nm.

In another embodiment, there is no (HBL 135 located between the ETL 136 and the LEL 134. In yet other embodiments, the ETL 136 can be subdivided into two or more sublayers. In one illustrative example, the OLED device has no HBL 135 and only one HIL 130, EIL 138 and ETL 136. In another illustrative example, the EIL 138 is further divided into two sublayers (not shown), a first electron-injecting layer (EIL1) adjacent to the ETL 136 and a second electron-injecting layer (EIL2) located between the EIL1 and the cathode 140.

The anode 120 and cathode 140 of the OLED 100 are connected to a voltage/current source 150, through electrical conductors 160. Applying a potential between the anode 120 and cathode 140 such that the anode 120 is at a more positive potential than the cathode 140 operates the OLED. Holes are injected into the organic EL element from the anode 120.

Enhanced device stability can sometimes be achieved when the OLED 100 is operated in an AC mode where, for some time period in cycle, the potential bias is reversed and no current flows. An example of an AC driven OLED is described in U.S. Pat. No. 5,552,678.

For full color display, the pixelation of LELs can be needed. This pixelated deposition of LELs is achieved using shadow masks, integral shadow masks, U.S. Pat. No. 5,294,870, spatially defined thermal dye transfer from a donor sheet, U.S. Pat. Nos. 5,688,551; 5,851,709, and 6,066,357, and inkjet method, U.S. Pat. No. 6,066,357.

OLEDs of this invention can employ various well-known optical effects in order to enhance their emissive properties if desired. This includes optimizing layer thicknesses to yield improved light transmission, providing dielectric mirror structures, replacing reflective electrodes with light-absorbing electrodes, providing anti-glare or anti-reflection coatings over the display, providing a polarizing medium over the display, or providing colored, neutral density, or color-conversion filters over the display. Filters, polarizers, and anti-glare or anti-reflection coatings can be specifically provided over the OLED or as part of the OLED.

Embodiments of the invention can provide EL devices that have good luminance efficiency, good operational stability, excellent color and reduced drive voltages. Embodiments of the invention can also give reduced voltage rises over the lifetime of the devices and can be produced with high reproducibility and consistently to provide good light efficiency. They can have lower power consumption requirements and, when used with a battery, provide longer battery lifetimes.

The invention and its advantages are further illustrated by the specific examples that follow. The term "percentage" or "percent" and the symbol "%" indicate the volume percent (or a thickness ratio as measured on a thin film thickness monitor) of a particular first or second compound of the total material in the layer of the invention and other components of the devices. If more than one second compound is present, the total volume of the second compounds can also be expressed as a percentage of the total material in the layer of the invention.

EXPERIMENTAL RESULTS

EL devices 1-1 to 1-20 were constructed in the following manner:

1. A glass substrate, coated with an approximately 60 nm layer of indium-tin oxide (ITO) as the anode, was sequentially ultrasonicated in a commercial detergent, rinsed in deionized water and exposed to an oxygen plasma for about 1 minute.
2. A 10 nm layer of DipyrAH-6ino[2,3-f:2',3'-h]quinoxaline-2,3,6,7,10,11-hexacarbonitrile (HAT-CN) was then vacuum-deposited as an electron-injection layer (HIL).
3. Next, a hole transporting layer (HTL) of N,N'-di-1-naphthyl-N,N'-diphenyl-4,4'-diaminobiphenyl (NPB) was vacuum-deposited to a thickness of 80 nm.
4. A 40 nm light-emitting layer consisting of a mixture of the host, yellow emitter and amine stabilizer as indicated in Table 1 was then vacuum-deposited onto the HTL.
5. An electron transporting layer (ETL) of a 1:1 mixture of 8-[1,1'-biphenyl]-4-yl-3,7,10-triphenylfluoranthene and 9-[1,1'-biphenyl]-4-yl-3,7,10-triphenylfluoranthene having a thickness of 10 nm was vacuum-deposited over the LEL.

6. A 20 nm thick electron injecting layer (EIL) of 49% lithium 8-hydroxyquinolate, 49% 4,7-diphenyl-1,10-phenanthroline and 1% lithium metal was then vacuum-deposited over the ETL.
7. A 100 nm cathode of aluminum was then formed over the EIL.

The above sequence completed the deposition of the EL device.

The device, together with a desiccant, was then hermetically packaged in a dry glove box for protection against the ambient environment. The cells thus formed were tested for efficiency and color at an operating current density of 20 mA/cm$^2$ and the results are reported in the form of luminous yield (cd/A), external quantum efficiency (EQE), and CIE (Commission Internationale de l'Eclairage) coordinates. Devices were aged electrically at room temperature at current density of 80 mA/cm$^2$ in DC mode. The lifetime ($T_{50}$), or operational stability, of an OLED device is defined as the number of hours required for the luminance at 80 mA/cm$^2$ to drop to half the luminance of the fresh device. Dpyn is 5,12-di-1-pyrenylnaphthacene.

TABLE 1

Yellow LEL Variations

| Example | Host | Yellow Emitter | Stabilizer | V | cd/A | CIE$_x$ | CIE$_y$ | T$_{50}$ |
|---|---|---|---|---|---|---|---|---|
| 1-1 (Comp) | AH-1 | none | AS-1 (5%) | 3.4 | 23.9 | 0.306 | 0.632 | 190 |
| 1-2 (Comp) | AH-1 | TD-1 (3%) | none | 3.7 | 12.7 | 0.517 | 0.471 | 300 |
| 1-3 (Inv) | AH-1 | TD-1 (3%) | AS-1 (5%) | 3.6 | 13.9 | 0.516 | 0.478 | 850 |
| 1-4 (Inv) | AH-1 | TD-8 (3%) | AS-1 (5%) | 5.5 | 11.6 | 0.484 | 0.504 | 2000 |
| 1-5 (Comp) | AH-1 | TD-1 3% | NPB (5%) | 3.5 | 14.0 | 0.516 | 0.473 | 230 |
| 1-6 (Comp) | AH-1 | rubrene (3%) | NPB (5%) | 4.1 | 11.1 | 0.499 | 0.493 | 360 |
| 1-7 (Comp) | AH-1 | rubrene (3%) | AS-1 (5%) | 4.2 | 10.5 | 0.503 | 0.491 | 400 |
| 1-8 (Comp) | AH-1 | Dpyn (3%) | AS-1 (5%) | 4.2 | 6.7 | 0.357 | 0.607 | 900 |
| 1-9 (Comp) | AH-4 | none | AS-1 (5%) | 3.8 | 23.2 | 0.307 | 0.631 | 180 |
| 1-10 (Comp) | AH-4 | TD-1 (3%) | none | 4.2 | 11.2 | 0.519 | 0.468 | 310 |
| 1-11 (Inv) | AH-4 | TD-1 (3%) | AS-1 (5%) | 4.1 | 13.3 | 0.516 | 0.478 | 900 |
| 1-12 (Comp) | AH-4 | rubrene (3%) | AS-1 (5%) | 5.0 | 9.2 | 0.499 | 0.496 | 540 |
| 1-13 (Inv) | AH-1 | TD-1 (3%) | AS-1 (1%) | 3.5 | 14.2 | 0.516 | 0.476 | 500 |
| 1-14 (Inv) | AH-1 | TD-1 (3%) | AS-1 (2%) | 3.5 | 14.9 | 0.511 | 0.482 | 500 |
| 1-15 (Inv) | AH-1 | TD-1 (3%) | AS-1 (10%) | 3.5 | 15.9 | 0.519 | 0.476 | 1000 |
| 1-16 (Inv) | AH-1 | TD-1 (3%) | AS-1 (20%) | 3.5 | 17.8 | 0.527 | 0.469 | 1500 |
| 1-17 (Inv) | AH-1 | TD-1 (3%) | AS-1 (40%) | 3.3 | 16.0 | 0.518 | 0.478 | 1300 |
| 1-18 (Inv) | AH-1 | TD-1 (1%) | AS-1 (5%) | 3.5 | 19.0 | 0.480 | 0.508 | 500 |
| 1-19 (Inv) | AH-1 | TD-1 (5%) | AS-1 (5%) | 3.5 | 13.0 | 0.533 | 0.463 | 950 |
| 1-20 (Inv) | AH-1 | TD-1 (10%) | AS-1 (5%) | 3.5 | 11.8 | 0.541 | 0.456 | 650 |

Figure 2:
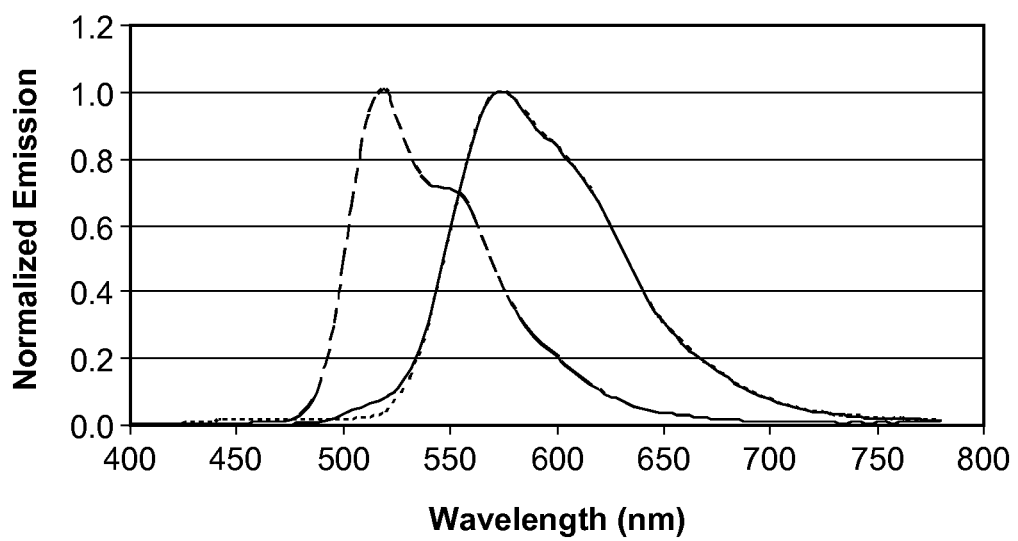
FIG. 2 shows the normalized EL spectra of comparative and inventive OLED devices.

The results in Table 1 show that the addition of a diarylamino-substituted 9,10-disubstituted anthracene to a combination of an anthracene host and a substituted rubrene yellow emitter can unexpectedly provide a large improvement in stability as well as efficiency improvements. For example, compare the results from the addition of a diarylamino-substituted 9,10-disubstituted anthracene stabilizer in inventive sample 1-3 and 1-11 to comparative examples 1-2 and 1-10 lacking the stabilizer. As can be seen in FIG. 2, there is practically no effect on the light emission, thus indicating that the diarylamino-substituted 9,10-disubstituted anthracene is not emitting more than about 5% green light. The use of an amine (NPB) not of Formula (3) as in samples 1-5 and 1-6 fails to provide any stabilization. Using the diarylamino-substituted 9,10-disubstituted anthracene also fails to provide any stabilization with tetracene emitters not of Formula (2): see samples 1-6 to 1-8 and 1-12. The effect is not dependent on any particular 9,10-diarylanthracene host (see samples 1-3 and 1-11) or any particular compound of Formula (2) (see sample 1-4). Examination of samples 1-3 and 1-13 to 1-20 indicate that the best results are obtained when the compound of Formula 2 is present at 3% or greater and the diarylamino-substituted 9,10-disubstituted anthracene stabilizer is present at 5% or greater.

EL devices 2-1 to 2-7 were constructed in the following manner:
1. A glass substrate, coated with an approximately 60 nm layer of indium-tin oxide (ITO) as the anode, was sequentially ultrasonicated in a commercial detergent, rinsed in deionized water and exposed to an oxygen plasma for about 1 minute.
2. A 10 nm layer of HAT-CN was then vacuum-deposited as an electron-injection layer (HIL).
3. Next, a hole transporting layer of NPB was vacuum-deposited to a thickness of 70 nm.
4. A 40 nm light-emitting layer consisting of a mixture of the host, yellow emitter and amine stabilizer as indicated in Table 2 was then vacuum-deposited onto the HTL.
5. An electron transporting layer of a 1:1 mixture of 8-[1,1'-biphenyl]-4-yl-3,7,10-triphenylfluoranthene and 9-[1,1'-biphenyl]-4-yl-3,7,10-triphenylfluoranthene having a thickness of 40 nm was vacuum-deposited over the LEL.
6. A 3 nm thick electron injecting layer of lithium 2-(1,10-phenanthrolin-2-yl)phenolate was then vacuum-deposited over the ETL.
7. A 100 nm cathode of aluminum was then formed over the EIL.

The above sequence completed the deposition of the EL device. The device, together with a desiccant, was then hermetically packaged in a dry glove box for protection against the ambient environment. Samples 2-4 and 2-5 all had an additional 20 nm thick LEL of NPB with 3% TD-1 between steps 3-4. This additional LEL was also present in samples 2-6 and 2-7 except its thickness was reduced to 4 nm and an additional 20 nm thick red LEL of NPB host with 0.5% red dopant 5,10,15,20-tetraphenyl-bisbenz[5,6]indeno[1,2,3-cd:1',2',3'-lm]perylene was added between step 3 and the additional 4 nm thick LEL. Results are listed in Table 2.

TABLE 2

Yellow LEL Variations

| Example | Host | Yellow Emitter | Stabilizer | V | cd/A | CIE$_x$ | CIE$_y$ | T$_{50}$ |
|---|---|---|---|---|---|---|---|---|
| 1-1 (Comp) | AH-6 | none | AS-1 (5%) | 3.4 | 25.7 | 0.311 | 0.634 | 300 |
| 1-2 (Comp) | AH-6 | TD-1 (3%) | none | 3.5 | 15.9 | 0.516 | 0.476 | 370 |
| 1-3 (Inv) | AH-6 | TD-1 (3%) | AS-1 (5%) | 3.4 | 16.9 | 0.510 | 0.484 | 1000 |

TABLE 2-continued

Yellow LEL Variations

| Example | Host | Yellow Emitter | Stabilizer | V | cd/A | $CIE_x$ | $CIE_y$ | $T_{50}$ |
|---|---|---|---|---|---|---|---|---|
| 1-4 (Inv) | AH-6 | TD-1 (3%) | none | 3.4 | 23.8 | 0.457 | 0.523 | 300 |
| 1-5 (Comp) | AH-6 | TD-1 (3%) | AS-1 (5%) | 3.5 | 18.5 | 0.519 | 0.477 | 850 |
| 1-6 (Comp) | AH-6 | TD-1 (3%) | none | 3.5 | 19.1 | 0.470 | 0.508 | 300 |
| 1-7 (Comp) | AH-6 | TD-1 (3%) | AS-1 (5%) | 3.5 | 15.4 | 0.536 | 0.460 | 900 |

The results in Table 2 confirm that the use of a diarylamino-substituted 9,10-disubstituted anthracene stabilizes LELs with a 9,10-diarylanthracene and an emitter of Formula (2).

The invention has been described in detail with particular reference to certain preferred embodiments thereof, but it will be understood that variations and modifications can be effected within the spirit and scope of the invention.

PARTS LIST

| | |
|---|---|
| 100 | OLED |
| 110 | Substrate |
| 120 | Anode |
| 130 | Hole-Injecting layer (HIL) |
| 132 | Hole-Transporting layer (HTL) |
| 134 | Light-Emitting layer (LEL) |
| 135 | Hole-Blocking Layer (HBL) |
| 136 | Electron-Transporting layer (ETL) |
| 138 | Electron-Injecting layer (EIL) |
| 140 | Cathode |
| 150 | Voltage/Current Source |
| 160 | Electrical Connectors |

The invention claimed is:

1. An OLED device comprising an anode, a cathode and a yellow light-emitting layer located therebetween, the light-emitting layer comprising:

(a) a 9,10-diarylanthracene host represented by:

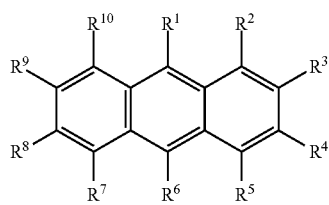

wherein:
$R^1$ and $R^6$ each independently represents an aryl group having 6-24 carbon atoms;
$R^3$ and $R^8$ are each independently chosen from hydrogen, alkyl groups from 1-24 carbon atoms or aromatic groups from 5-24 carbon atoms;
$R^2$, $R^4$, $R^5$, $R^7$, $R^9$ and $R^{10}$ are hydrogen;

(b) a yellow light-emitting tetracene TD-8:

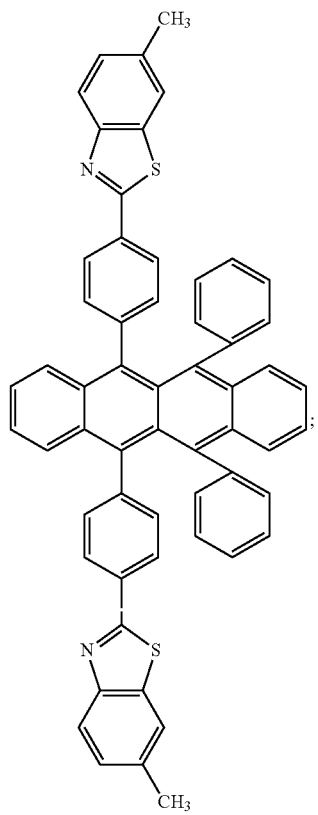

and
(c) a non-light-emitting diarylamine substituted 9,10-diarylsubstituted anthracene according to Formula (3):

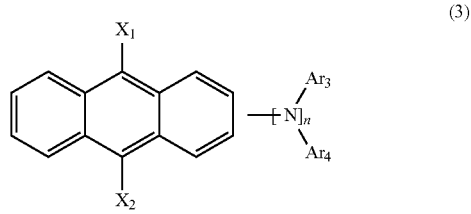

wherein:
$X_1$ and $X_2$ are independently selected aryl groups of 6 to 30 nucleus carbon atoms;
$Ar_3$ and $Ar_4$ each independently represents a substituted or unsubstituted aryl group of 6 to 30 nucleus carbon atoms where $Ar_1$ and $Ar_2$ or $Ar_3$ and $Ar_4$ can optionally be joined together; and
n is 2.

2. The OLED device of claim 1 wherein in the diarylamine substituted 9,10-diarylsubstituted anthracene according to Formula (3), $X_1$ and $X_2$ are independently selected from phenyl or naphthyl groups; $Ar_3$ and $Ar_4$ are independently selected from phenyl or naphthyl groups; and n is 2.

3. The OLED device of claim 1 wherein in light-emitting layer, the diarylamine 9,10-diarylsubstituted anthracene according to Formula (3) is present at 5% or greater by volume and the tetracene TD-8 is present at 3% or greater.

4. An OLED device comprising an anode, a cathode and a yellow light-emitting layer located therebetween, the light-emitting layer comprising:
(a) a 9,10-diarylanthracene host represented by:

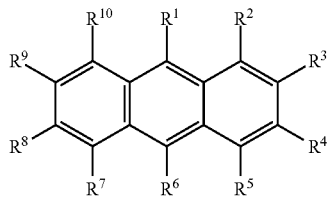

wherein:
$R^1$ and $R^6$ each independently represents an aryl group having 6-24 carbon atoms; $R^3$ and $R^8$ are each independently chosen from hydrogen, alkyl groups from 1-24 carbon atoms or aromatic groups from 5-24 carbon atoms; $R^2$, $R^4$, $R^5$, $R^7$, $R^9$ and $R^{10}$ are hydrogen;
(b) a yellow light-emitting tetracene according to TD-1:

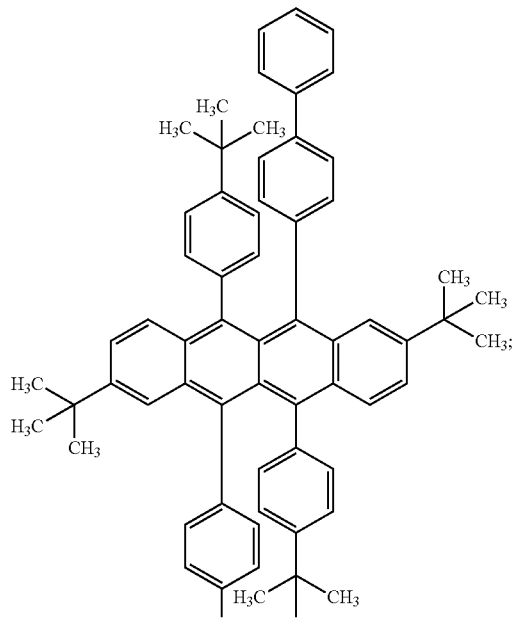

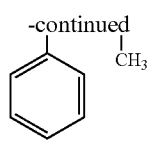

and (c) a non-light-emitting diarylamine substituted 9,10-diarylsubstituted anthracene according to Formula (3):

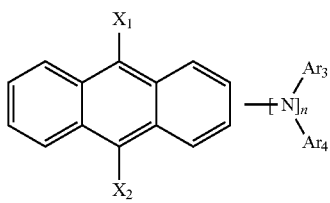

(3)

wherein:
$X_1$ and $X_2$ are independently selected aryl groups of 6 to 30 nucleus carbon atoms; $Ar_3$ and $Ar_4$ each independently represents a substituted or unsubstituted aryl group of 6 to 30 nucleus carbon atoms where $Ar_1$ and $Ar_e$ or $Ar_3$ and $Ar_4$ can optionally be joined together; and n is 2.

5. The OLED device of claim 4 wherein in the diarylamine substituted 9,10-diarylsubstituted anthracene according to Formula (3), $X_1$ and $X_2$ are independently selected from phenyl or naphthyl groups; $Ar_3$ and $Ar_4$ are independently selected from phenyl or naphthyl groups; and n is 2.

6. The OLED device of claim 4 wherein in light-emitting layer, the diarylamine 9,10-diarylsubstituted anthracene according to Formula (3) is present at 5% or greater by volume and the tetracene TD-1 is present at 3% or greater.

7. The OLED device of claim 1 wherein in the 9,10-diarylanthracene host: $R^1$ and $R^6$ each represent an independently selected phenyl group, biphenyl group, or naphthyl group; $R^3$ represents hydrogen or an aromatic group from 6-24 carbon atoms; and $R^2$, $R^4$, $R^5$, $R^7$-$R^{10}$ represent hydrogen.

8. The OLED device of claim 4 wherein in the 9,10-diarylanthracene host:
$R^1$ and $R^6$ each represent an independently selected phenyl group, biphenyl group, or naphthyl group; $R^3$ represents hydrogen or an aromatic group from 6-24 carbon atoms; and $R^2$, $R^4$, $R^5$, $R^7$—$R^{10}$ represent hydrogen.

* * * * *